Dec. 11, 1951 W. R. FAUST ET AL 2,577,746
VARIABLE REACTANCE DECOUPLING CIRCUIT
Filed Nov. 11, 1944 2 SHEETS—SHEET 1
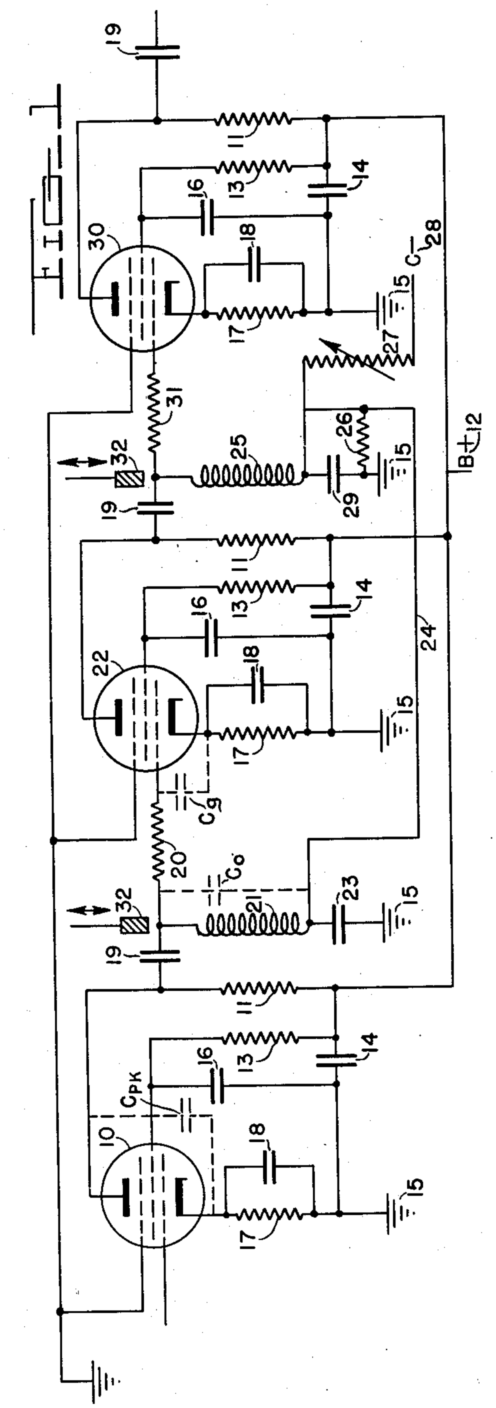
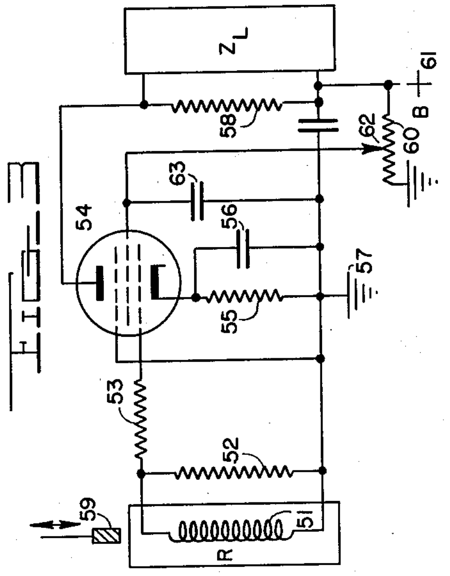
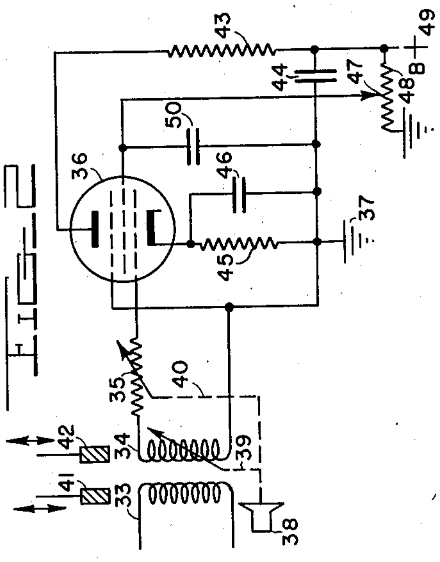
Inventors
WILLIAM R. FAUST
HUGO M. BECK
By [signature]
Attorney

VARIABLE REACTANCE DECOUPLING CIRCUIT

Filed Nov. 11, 1944 2 SHEETS—SHEET 2

Inventors
WILLIAM R. FAUST
HUGO M. BECK

By [signature]
Attorney

UNITED STATES PATENT OFFICE 2,577,746

VARIABLE REACTANCE DECOUPLING CIRCUIT

William R. Faust and Hugo M. Beck, Washington, D. C.

Application November 11, 1944, Serial No. 563,045

4 Claims. (Cl. 179—171)

(Granted under the act of March 3, 1883, as amended April 30, 1928; 370 O. G. 757)

This invention relates to tuned vacuum tube amplifier circuits, and is directed to the problem of the detuning of such amplifiers through the variations in input capacity accompanying variation in gain.

As is well known, the Miller effect causes the grid-anode capacity to appear as an input capacitance, which depends upon the phase angle of the plate load, and varies with the gain of the tube. Screen grid tubes have been employed to decrease the grid-anode capacity, but due to the increased gain of such tubes over the triode, the input capacity remains of substantial value.

When the tube is driven by a tuned circuit, the input capacity appears in shunt across the tuned circuit, and must be considered in aligning the same. In a variable gain amplifier, the shunting capacity varies directly with the gain, and causes detuning of the circuit with gain variation. At low frequencies this effect can be minimized by swamping the shunt capacity. At higher frequencies, the magnitude of the input capacity becomes comparable in magnitude to the tuning capacity, and the detuning is a serious factor in the operation of the amplifier.

Particularly in the intermediate frequency amplifier of superheterodyne receivers the large variation with gain of a substantial fraction of the capacity across the inductances limits the performance of the circuit, since detuning the amplifier from the intermediate frequency signal introduced to it can reduce the gain below a usable level.

Accordingly, it is an object of the invention to stabilize the frequency response of a tuned amplifier with change in gain.

Another object of the invention is to minimize the detuning effect of varying input capacity on a tuned amplifier.

A further object of the invention is to minimize the detuning effect on a tuned circuit of a load including variable reactance.

The invention stabilizes the frequency response of a tuned amplifier by minimizing the variations in the capacitative component of the input current with variation of tube input capacity. This is effectuated by a phase shifting component in the grid circuit.

The operation of the present invention will be apparent from the following detailed description taken in conjunction with the drawings wherein Figure 1 is a circuit diagram showing a typical I. F. amplifier used in micro-wave receivers.

Figure 2 illustrates a portion of a receiving system wherein the circuit diagram shows one stage of a double tuned, over-coupled I. F. amplifier whereby the gain of the tubes may be varied by means of a potentiometer connected to the positive supply voltage.

Figure 3 illustrates a one stage single tuned I. F. amplifier having a similar gain control as shown in Figure 2.

Figure 6:
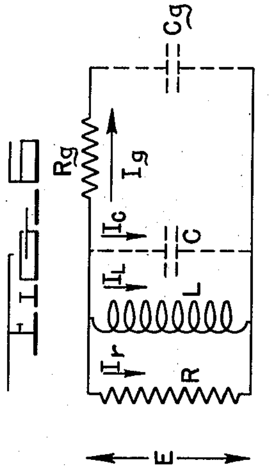
Figure 6 illustrates the equivalent circuit of the input of an amplifier stage incorporating the invention.

Referring now more particularly to Figure 1 there is represented a circuit diagram of a tuned fixed frequency amplifier, which may constitute a portion of the I. F. section of a micro-wave receiver. The I. F. stages may employ pentode tubes or other electron discharge devices for amplification, although it is apparent that triodes or tetrodes may be used, one of such pentode is designated by numeral 10 and is incorporated in the 1st I. F. stage.

The input circuit of the I. F. amplifier tube 10, while not shown, may be assumed to be connected to other I. F. stages or to the output of a chain of R. F. amplifiers. The tube 10 output circuit consists of a load resistor 11 connected between the tube's anode and a source of positive supply voltage 12. The high potential end of the load resistor 11 is connected to one end of a bias resistor 13 whose other end is connected to the screen grid of tube 10. The voltage drop across this resistor maintains the screen grid at a proper value for an optimum operation of the circuit. A blocking-capacitor 14 inserted in the tube's circuit between the common connection of resistors 11 and 13 and ground 15 effectively isolates the D. C. potential therefrom while permitting a return of the R. F. component of current thereto. A by-pass capacitor 16 connected across the screen grid resistor 13 permits escape of R. F. to ground 15.

Bias for the grid of tube 10 is provided by the voltage drop across a cathode resistor 17 having a capacitor 18 in shunt thereto which by-passes R. F. to ground.

Amplifier tube 10 has its output circuit coupled to the input circuit of the succeeding I. F. stage by a coupling capacitor 19 which is connected between the anode of tube 10 and the common end of a grid resistor 20 and an input inductance 21. The other end of resistor 20 is connected to the control grid of tube 22. A blocking capacitor 23 connected between ground 15 and the other end of the input inductance 21 permit bias voltage to be applied to the grid of tube 22 while also providing a return circuit to ground for R. F. currents. A lead 24 extends from this common connection of inductance 21 and capacitor 23 to the low potential end of an inductance 25 of the succeeding I. F. stage and is further connected at this point to adjacent ends of resistors 26 and 27, forming thereof a potentiometer. Resistor 27, which may be made variable has its other end connected to a negative voltage supply 28 while the other end of resistor 26 is secured to the grounded terminal of a blocking capacitor 29. The other end of inductance 25 is connected to the grid of another I. F. amplifier tube 30 through a grid resistor 31. Capacitor 29 has its other terminal connected to the low potential end of inductance 25 which completes the grid circuit to the cathode bias resistor of the tube 30 while isolating the negative supply from ground. The output of each stage of amplification may be applied to the grid of the succeeding tube by a coupling capacitor 19 while the final I. F. stage may be similarly coupled to a converter or additional stages of amplification.

The purpose of the resistors 26 and 27 is to provide a variable gain for the various stages of amplification by changing the value of grid bias on the tubes 22 and 30.

The inductance 21, as well as the inductance 25, is effectively in parallel with three capacities: the interelectrode capacity $C_{pk}$, existing between the anode of tube 10 and R. F. ground, the capacity $C_o$, which is the distributed capacity of the inductance 21 of the succeeding stage, the input capacity $C_g$ appearing across the grid and the cathode of tube 22. This input capacity also includes the interelectrode capacity between the grid and the anode of tube 22.

The capacity $C_o$ and capacitor 19 in conjunction with inductance 21 and resistor 11 forms a parallel resonant circuit, the frequency of which may be varied by sliding an iron slug 32 axially within the inductance 13.

Other circuit components not already referred to by number will have the same reference characters as accorded them in the 1st I. F. stage.

In the operation of this amplifying circuit it is to be assumed that several R. F. stages precedes the I. F. section shown in Figure 1, and furnishes the energy to drive the control grid of tube 10. In accordance with the variations in amplitude of the R. F. currents supplied to this grid, a value of positive voltage on said grid will permit a flow of plate current in the tube which will vary in a manner proportional to the amplitude of the energizing source. This plate current will develop a voltage drop across the load resistor 11, which varies the potential impressed on the plates of the condenser 19 between the output and input circuits of tubes 10 and 22 respectively, thereby varying the voltage impressed across the grid circuit of tube 22 which varies the voltage across its load resistor, etc. to be repeated for the succeeding stages.

The gain of the cascaded amplifiers may be varied by a source of automatic gain control voltage or any other source, for instance, such as a negative voltage supply wherein the negative bias applied to the grid of the tubes may be changed by varying the resistor 27, which forms a section of a potentiometer in series with the resistor 26, having one end thereof grounded.

Reference is now made to Figure 6 of the drawings wherein a circuit diagram illustrates an equivalent output and input circuit to that shown in the first two stages of I. F. amplification of Figure 1 in which the letter R refers to resistor 11, L, the inductance 21, C, the capacitance of condenser 19 as well as that of $C_o$ the capacity existing between the turns of the inductance 21 or 25, $R_g$ the grid resistor 20 and $C_g$ the input capacitance $C_g$. The currents flowing within the circuit in accordance with its operation is as follows, IR the current flowing in the anode resistor 11 of tube 10; IL, the current flowing in the inductance 21 which is parallel to said resistor; $I_c$, the current flowing in shunt to said resistor and inductance, and $I_g$, that current flowing in the input circuit of the tube 22.

In this diagram, Figure 6, there is a voltage E applied across the parallel combination of the load resistance R of tube 10, Figure 1, and of inductance L and capacity C of tube 22, Figure 1.

Figure 7:
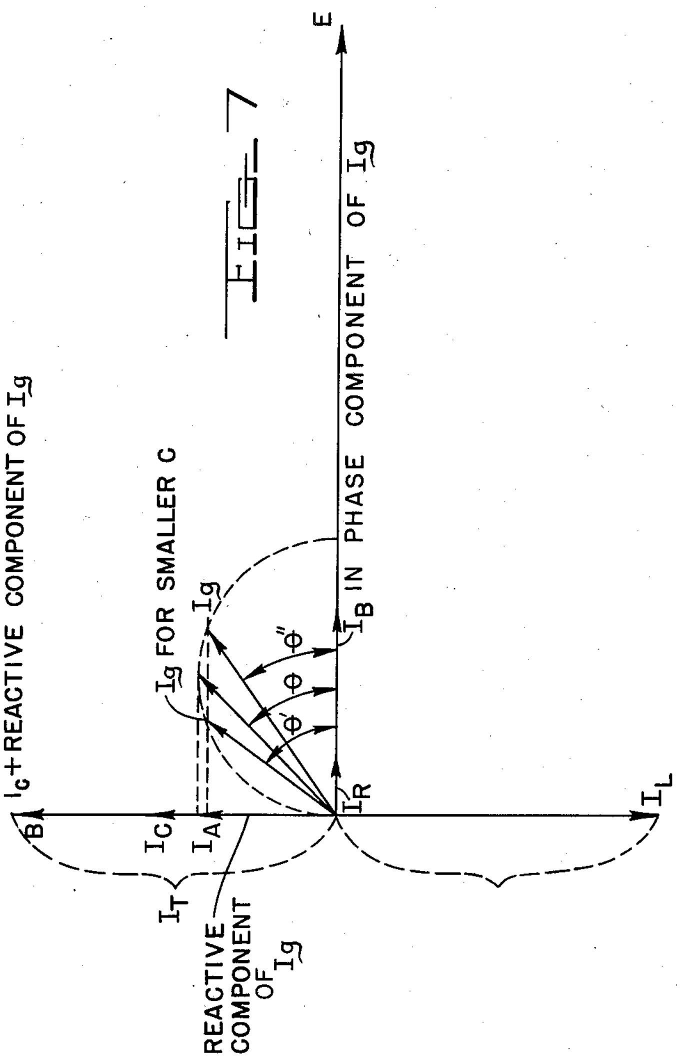
Figure 7 is a vector diagram showing the phase relations of current in the circuit of Figure 6.

Plotting phase relations of this circuit vectorially, as in Figure 7, we have line E representative of this voltage and an in-phase component of current designated as $I_R$, and another component of current $I_L$ 90° out of phase flowing in inductance L and lagging the applied voltage E by 90°. Another line $I_C$ is plotted positively as indicative of the current drawn by the distributed capacity of inductance L. This current leads the applied voltage by 90°.

Referring to the circuit diagram, Figure 6, again, we find current flowing through the grid resistor $R_g$ and the input capacitance $C_g$ of the tube. The value of this current is plotted vectorially as line $I_g$ and it leads the applied voltage at some angle $\theta$. This current has a reactive component as indicated at $I_A$, which when added to the current $I_C$ flowing in the distributed capacity, makes up the total capacitative current $I_t$, ($I_c$, and $I_A$, the reactive component of $I_g$). This total capacitative current $I_t$ balances the inductive current $I_L$ at the resonant frequency of the input circuit. The current $I_g$ also has an inphase component $I_B$ which is plotted in phase with the applied voltage as indicated on the diagram in Figure 7.

Suppose that the input capacitance is made smaller, as when the gain is decreased by raising the control grid bias or by change in phase angle of the plate load, then the magnitude of the current $I_g$ is decreased according to expression $$\frac{E}{\sqrt{R^2+\left(\frac{1}{WC_g}\right)^2}}$$

At the same time the angle of lead $\theta$ is increased to $\theta'$.

If the input capacitance is made larger as by increasing the gain of the tube, then the magnitude of the current is increased and the vector line is plotted to make a decreased angle of lead $\theta''$.

As seen from the diagram, this does not change appreciably the reactive component of $I_g$, hence the frequency of resonance is affected but slightly.

It is therefore apparent that $R_g$ in combination with $C_g$ determines the angle $\theta$. Where $$R_g=\frac{1}{WC_g}$$

the variation of $I_A$ with $C_g$ is zero, and in the region on either side of $\theta=45°$ the variation is much less than elsewhere. It is particularly to be noted that the region of $\theta=0°$ is to be avoided since the capacitative component will vary directly with $\theta$ and with variations in $C_g$.

A mathematical discussion of the currents flowin the circuit of Figure 6 is as follows:

The current $I_g$ is given by:

$$(1)\qquad I_g=\frac{E}{Z}=\frac{E}{R_g-\frac{J}{WC_g}}=\frac{EWC_g}{WC_gR_g-J}$$

where Z is the impedance of the series circuit consisting of $R_g$ and $C_g$. The above expression can be written as follows:

$$(2)\qquad I_g=\frac{E(WC_g)^2R_g}{1+(WC_gR_g)^2}+J\frac{EWC_g}{1+(WC_gR_g)^2}$$

which has the following active and reactive components $$(3)\qquad \text{Active comp.}=\frac{E(WC_g)^2R_g}{1+(WC_gR_g)^2}$$

$$(4)\qquad \text{Reactive comp.}=\frac{EWC_g}{1+(WC_gR_g)^2}$$

It is obvious from the preceding discussion and vector diagram that the active and reactive components of $I_g$ should be equal; hence, $$(5)\qquad \frac{E(WC)^2R_g}{1+(WC_gR_g)^2}=\frac{EWC_g}{1+(WC_gR_g)^2}$$

It follows that $$(6)\qquad R_g=\frac{1}{WC_g}$$

$$(7)\qquad R^2_g=\frac{1}{(WC_g)^2}$$

or $$(8)\qquad (WC_gR_g)^2=1$$

Equation 8 may also be obtained by differentiating (4) with regard to $C_g$ and equating to zero.

By substituting Equation 8 in Equation 4 there obtains $$(9)\qquad \text{Reactive comp.}=\frac{EWC_g}{2}$$

Now since the total reactive current must equal zero for resonance; i. e., inductive current plus total capacitive current is equal to zero for resonance, it follows that $$(10)\qquad \frac{-E}{WL}+\frac{EWC_g}{2}+\frac{E}{\frac{+1}{WC}}=0$$

So that $$(11)\qquad W=\frac{1}{\sqrt{L\left(C+\frac{C_g}{2}\right)}}\ \text{for optimum } R_g$$

In the equivalent circuit shown in Figure 6, the resistive component of the input impedance is neglected since this is normally of sufficiently high value as not to appreciably affect the operation of the circuit insofar as detuning of the input circuit is concerned. In any case the value of $R_g$ is selected so that the operating region defined by variation in $C_g$ includes the point in $I_g$ locus whose tangent cuts the reactive current axis perpendicularly.

Referring to Figure 1 the resistor 20 effectively corrects the phase angle of the current flowing in the input circuits when the gain of the tubes in said circuit is varied. In this I. F. circuit of Figure 1 the output will show a single response peak over a relatively narrow band of frequencies.

In a specific receiver used for purposes of illustration, pentode type 6AC7 tubes are used in the I. F. amplifier section.

The anode load resistors are 2.2 k. ohms.

All by-pass blocking condensers are .001 mfd.

Cathode bias resistors are 150 ohms.

And the grid resistors 20 and 31 are approximately 220 ohms.

The double-tuned over-coupled circuit shown in Figure 2 have a broad band tuning characteristic unobtainable with the circuit of Figure 1 wherein a single response peak over a relatively narrow band of frequencies permit fairly critical tuning.

In this receiver shown, Figure 2, primary and secondary coupling coils 33 and 34 respectively, form part of the output circuit of one stage and the input circuit of a succeeding stage of amplification respectively. A grid resistor 35 is inserted in series with one end of the inductance 34 and the grid of tube 36 for the purpose of maintaining a definite phase shift of the current in the input circuit constant when the gain of the tube is varied. The other end of the inductance 34 is connected to the ground 37, thereby completing the input circuit of the tube. This coil may have its inductive value varied by a ganged assembly comprising a rotatable knob 38 and a linkage 39. Another linkage 40 simultaneously operable by the knob 38 controls the movement of suitable means for varying the value of resistance of the grid resistor 35. Both coils 33 and 34 may be tuned to resonance separately by the axially movable permeability slugs 41 and 42 positioned at one of the ends of the coils.

The anode circuit comprises a load resistor 43 having a capacitor 44 inserted in the circuit between the high potential end of resistor 43 and the ground 37, which provides a return path to ground for R. F. currents while effectively separating therefrom the D. C. potential 49.

Bias for the tube is obtained by the voltage drop across cathode resistor 45 having a by-pass capacitor 46 in shunt therewith for returning R. F. currents in the cathode circuit to ground.

The screen grid of tube 36 is connected to a variable slider 47 of a potentiometer 48 having one end grounded and its other end connected to the positive potential supply 49, the movable slider 47 providing a means of varying the gain of the tube for receiving different amplitudes of signals. A by-pass capacitor 50 connected across the screen grid and ground permits the R. F. currents to be returned to ground.

This circuit provides a wide band response characteristic which is oftentimes desirable in the reception of video signals.

Figure 5:
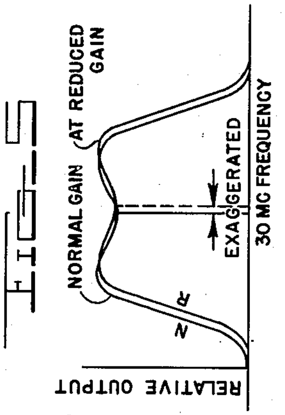
Figure 5 shows a signal response curve, of the same amplifier stage as shown in Fig. 4 incorporating the invention.
Figure 4:
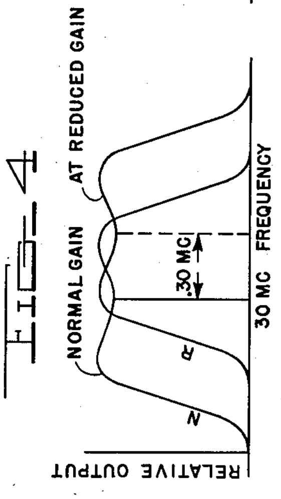
Figure 4 illustrates a band-pass frequency graph showing the normal and the reduced gain in the operation of a conventional double tuned, over-coupled receiver.

Attention is invited to Figures 4 and 5 wherein double humped curves N and R are illustrative of the frequency response characteristics of the receiver circuit shown in Figure 2 for normal gain and reduced gain conditions respectively. In the curves, relative output of signals are plotted as a function of frequency and both sets of curves are adjusted to be of the same relative size to clearly demonstrate the application of the invention to a specific circuit.

For purposes of illustration, a specific case involving a receiver having an I. F. circuit such as shown in Figure 2 but without the grid resistor 35 incorporated therein has been operated at normal gain in the 30 megacycle band of the radio spectrum. When the gain of the receiver has been reduced as by increasing the screen grid voltage of tube 36, a frequency shift of .30 megacycle was noted and is shown in Figure 4, as representative of the detuning effect caused by the phase shift of the input current. The resistor 35 was then inserted in the grid circuit of tube 36 and measurements made of the same normal and reduced gain, as in Figure 4 which showed practically no frequency shift as illustrated in Figure 5. Indeed the only evidence of detuning was noticeable by a small distortion of received signals as viewed on an oscilloscope.

Referring to Figure 3 a single tuned I. F. amplifier stage is shown having circuit components therein similar to those of Figure 2.

The amplifier's input circuit is coupled to a suitable energy source "R" by an inductance 51 and a shunt resistor 52. One of their common ends are connected to a resistor 53 which is in series with the grid of a pentode tube 54 while their other ends are connected to the grounded end of the cathode bias resistor 55. A by-pass capacitor 56 permits the R. F. currents of the cathode circuit to return to ground 57. The suppressor grid of the tube is at ground potential by its connection to ground 57. An output circuit comprising a load resistor 58 has its ends connected to the anode of tube 54 and to a high potential positive supply shown as B+, respectively. A reactive load $Z_L$ connected in shunt, parallel to resistor 58, provides an appropriate load for the circuit. An iron core 59 is adapted to be moved axially and concentric of coil 51 to provide a means of tuning the input circuit to resonance.

A potentiometer 60 is connected at one of its ends to a suitable source of positive voltage 61 and has its other end grounded, providing thereof a means to change the screen grid bias of tube 54 and hence the gain of the received signal by moving a slider 62 on said potentiometer. A screen grid by-pass capacitor 63 connected across the anode of tube 54 and ground 57 completes the R. F. circuit to ground.

This circuit having resistor 53 in its grid circuit corrects the phaseal relation of currents in the input circuit of the tube 54 in a manner similar to the circuits of diagrams in Figures 1 and 2 which has been described in detail.

In amplifiers in the 30 mc. range and higher, it is of importance to be able to vary the gain of the tubes because at one moment the operator may be tuned on a fairly weak signal where practically the entire gain of the tubes may be necessary to bring the signal in, while in the next moment the signal level may rise to a value which would block the receiver unless some gain reduction is effected. Accordingly it is important that signals should not be lost due to frequency shifts during the transition from one condition to the other.

As certain modifications will suggest themselves to one versed in the art, it is to be understood that the foregoing is illustrative and not to be interpreted in a limiting sense except as required by the prior art and by the spirit of the appended claims.

The invention described herein may be manufactured and used by or for the Government of the United States of America for governmental purposes without the payment of any royalty thereon or therefor.

We claim:

1. An amplifier circuit comprising a first and a second electron discharge device, a load circuit connected to said first electron discharge device, a resonant input circuit for said second electron discharge device, said resonant input circuit being capacitively coupled to said load circuit, and a resistor connecting said input circuit and said second electron discharge device, said resistor having a value substantially equal to the input capacitative impedance of the second electron discharge device at the resonant frequency of the input circuit.

2. An amplifier circuit comprising a tube having an anode, a cathode, a control grid and a screen grid, a tuned input circuit for said tube, a load circuit connected to said anode, means for varying the potential of said screen grid, a resistor connected to said tuned input circuit and said control grid having a value substantially equal to the capacitative input impedance of the control grid for the frequency of the tuned input circuit at an intermediate value of screen grid potential.

3. A high vacuum tube amplifier comprising an input grid and an output anode, means for varying the gain of the tube whereby the effective input capacity at the input grid is varied over a range, a parallel resonant input circuit for exciting the grid and frequency sensitive to variations in shunt capacity, and phase shifting means connected in series with the resonant circuit and the grid having a resistance substantially equal to an intermediate value of the input grid capacitative reactance at the resonant frequency of the input circuit.

4. A transmission channel for a recurrent signal comprising an input circuit parallel resonant to the signal recurrence frequency and frequency sensitive to variations in shunt impedance, a load circuit fed by the input circuit and presenting a reactive impedance, means for varying the magnitude of the reactive impedance of the load circuit over a range, and coupling means connecting the input circuit to the load circuit having a resistance substantially equal to the reactance of the load impedance for the signal recurrence frequency at an intermediate point of said range.

WILLIAM R. FAUST.
HUGO M. BECK.

REFERENCES CITED

The following references are of record in the file of this patent:

UNITED STATES PATENTS

| Number | Name | Date |
|---|---|---|
| 1,978,514 | Tarzian | Oct. 30, 1934 |
| 1,985,952 | Roberts | Jan. 1, 1935 |
| 2,036,865 | Forbes | Apr. 7, 1936 |
| 2,188,504 | Freeman | Jan. 30, 1940 |
| 2,209,394 | Farrington | July 30, 1940 |
| 2,210,387 | Steere | Aug. 6, 1940 |
| 2,220,118 | Overbeck | Nov. 5, 1940 |
| 2,228,862 | Wessels | Jan. 14, 1941 |
| 2,237,420 | Ferris | Apr. 8, 1941 |
| 2,273,656 | Oosterhuis | Feb. 17, 1942 |
| 2,444,864 | Van Der Ziel | July 6, 1948 |